(12) United States Patent
Chang et al.

(10) Patent No.: US 9,960,275 B1
(45) Date of Patent: May 1, 2018

(54) METHOD OF FABRICATING AIR-GAP SPACER FOR N7/N5 FINFET AND BEYOND

(71) Applicant: Applied Materials, Inc., Santa Clara, CA (US)

(72) Inventors: Chih-Yang Chang, Cupertino, CA (US); Raymond Hoiman Hung, Palo Alto, CA (US); Tatsuya E. Sato, San Jose, CA (US); Nam Sung Kim, Sunnyvale, CA (US); Shiyu Sun, Santa Clara, CA (US); Bingxi Sun Wood, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/490,593

(22) Filed: Apr. 18, 2017

Related U.S. Application Data

(60) Provisional application No. 62/414,501, filed on Oct. 28, 2016.

(51) Int. Cl.
| | |
|---|---|
| *H01L 29/78* | (2006.01) |
| *H01L 29/66* | (2006.01) |
| *H01L 21/762* | (2006.01) |
| *H01L 21/768* | (2006.01) |
| *H01L 21/311* | (2006.01) |
| *H01L 21/02* | (2006.01) |

(52) U.S. Cl.
CPC ...... *H01L 29/7851* (2013.01); *H01L 21/0217* (2013.01); *H01L 21/31116* (2013.01); *H01L 29/6653* (2013.01); *H01L 29/66795* (2013.01)

(58) Field of Classification Search
CPC ............. H01L 29/7851; H01L 29/6653; H01L 29/66795; H01L 29/785; H01L 29/7853; H01L 29/0649; H01L 21/0217; H01L 21/31116; H01L 21/76264; H01L 21/76289; H01L 21/7682
See application file for complete search history.

(56) References Cited

U.S. PATENT DOCUMENTS

| | | | |
|---|---|---|---|
| 7,906,814 | B2 | 3/2011 | Lee |
| 8,362,572 | B2 | 1/2013 | Huang et al. |
| 8,637,384 | B2 | 1/2014 | Ando et al. |
| 9,252,233 | B2 | 2/2016 | Hsiao et al. |

(Continued)

OTHER PUBLICATIONS

International Search Report and Written Opinion for International Application No. PCT/US2017/053802 dated Jan. 9, 2018.

*Primary Examiner* — Christine Enad
(74) *Attorney, Agent, or Firm* — Patterson + Sheridan, LLP

(57) ABSTRACT

Embodiments disclosed herein relate to an improved transistor with reduced parasitic capacitance. In one embodiment, the transistor device includes a three-dimensional fin structure protruding from a surface of a substrate, the three-dimensional fin structure comprising a top surface and two opposing sidewalls, a first insulating layer formed on the two opposing sidewalls of the three-dimension fin structure, a sacrificial spacer layer conformally formed on the first insulating layer, wherein the sacrificial spacer layer comprises an aluminum oxide based material or a titanium nitride based material, and a second insulating layer conformally formed on the sacrificial spacer layer.

20 Claims, 5 Drawing Sheets

(56) References Cited

U.S. PATENT DOCUMENTS

| | | | |
|---|---|---|---|
| 2005/0250285 A1* | 11/2005 | Yoon | H01L 21/84 |
| | | | 438/283 |
| 2008/0029828 A1* | 2/2008 | Oh | H01L 29/66553 |
| | | | 257/401 |
| 2008/0293203 A1 | 11/2008 | Yoon et al. | |
| 2009/0197391 A1 | 8/2009 | Ohnuma et al. | |
| 2011/0097889 A1 | 4/2011 | Yuan et al. | |
| 2012/0168899 A1* | 7/2012 | Kim | H01L 21/7682 |
| | | | 257/522 |
| 2015/0263122 A1 | 9/2015 | Hsiao et al. | |
| 2015/0372140 A1* | 12/2015 | Liu | H01L 29/7848 |
| | | | 257/190 |
| 2016/0013186 A1 | 1/2016 | Bae et al. | |

* cited by examiner

US 9,960,275 B1

METHOD OF FABRICATING AIR-GAP SPACER FOR N7/N5 FINFET AND BEYOND

CROSS-REFERENCE TO RELATED APPLICATIONS

This application claims priority to U.S. provisional patent application Ser. No. 62/414,501, filed Oct. 28, 2016, which is herein incorporated by reference.

FIELD

Embodiments disclosed herein relate to an improved transistor with reduced parasitic capacitance and methods of manufacturing the transistor.

BACKGROUND

Semiconductor industry is now transitioning from 2D transistors, which are often planar, to 3D transistors having a three-dimensional gate structure. In 3D gate structures, the channel, source and drain are raised out of the substrate and the gate electrode is then wrapped around the channel on three sides (surfaces). The goal is to constrain the current to the raised channel, and abolish any path through which electrons may leak. In addition, the gate electrode controls the channel more effectively because it extends over more than one side of the channel. One such type of 3D transistor is known as FinFET (Fin field-effect transistor), in which the channel connecting the source and drain is a thin "fin" jutting out of the substrate. This results in the current being constrained to the channel, thereby preventing electrons from leaking.

For a FinFET transistor including a plurality of semiconductor fins (multi-fin FinFET), the parasitic capacitance inherently created between the source/drain regions and the gate electrode is increased significantly as compared to conventional planar FETs. The parasitic capacitance adversely affects the performance of the integrated circuits, limiting the frequency response of the device. Therefore, there is a need in the art for a method to form an improved multi-fin FinFET transistor with reduced parasitic capacitance.

SUMMARY

Embodiments disclosed herein relate to an improved transistor with reduced parasitic capacitance and methods of manufacturing the transistor. In one embodiment, a transistor device is provided. The transistor device includes a three-dimensional fin structure protruding from a surface of a substrate, the three-dimensional fin structure comprising a top surface and two opposing sidewalls, a first insulating layer formed on the two opposing sidewalls of the three-dimension fin structure, a conformal sacrificial spacer layer formed on the first insulating layer, wherein the sacrificial spacer layer comprises an aluminum oxide based material or a titanium nitride based material, and a conformal second insulating layer formed on the sacrificial spacer layer.

In another implementation, a method of forming a transistor device is provided. The method includes forming a three-dimension fin structure on a substrate, the three-dimension fin structure comprising a top surface and two opposing sidewalls, forming a first insulating layer conformally on the top surface and the two opposing sidewalls of the three-dimension fin structure, forming a sacrificial spacer layer conformally on the first insulating layer, wherein the sacrificial spacer layer comprises an aluminum oxide based material or a titanium nitride based material, subjecting the sacrificial spacer layer to a directional etch process to expose the first insulating layer at the top surface of the three-dimension fin structure, and forming a second insulating layer conformally on the first insulating layer at the top surface of the three-dimension fin structure and the sacrificial spacer layer on the two opposing sidewalls of the three-dimension fin structure.

In yet another implementation, the method includes forming a three-dimension fin structure on a substrate, the three-dimension fin structure comprising a top surface and two opposing sidewalls, forming a sacrificial spacer layer between a first insulating layer and a second insulating layer, wherein the first insulating layer is conformally formed on the top surface and the two opposing sidewalls of the three-dimension fin structure, wherein the sacrificial spacer layer comprises an aluminum oxide based material or a titanium nitride based material, and the air gap spacer has a thickness of about 4 nm or above, and exposing the first insulating layer at the top surface of the three-dimension fin structure by selectively removing the sacrificial spacer layer with an inductively coupled plasma, wherein selectively removing the sacrificial spacer layer is performed by flowing argon (Ar) into a plasma chamber at a first volumetric flowrate and flowing boron trichloride ($BCl_3$) into the plasma chamber at a second volumetric flowrate, wherein a ratio of the first volumetric flowrate to the second volumetric flowrate is about 1:10 or above, applying a bias power to a substrate support on which the substrate is disposed at about 0.028 $W/cm^2$ to about 0.056 $W/cm^2$, and removing the sacrificial spacer layer to create an air gap spacer between the first insulating layer and the second insulating layer by immersing the substrate in an aqueous solution obtained by mixing sulfuric acid and a hydrogen peroxide solution in a volume ratio of about 4:1.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
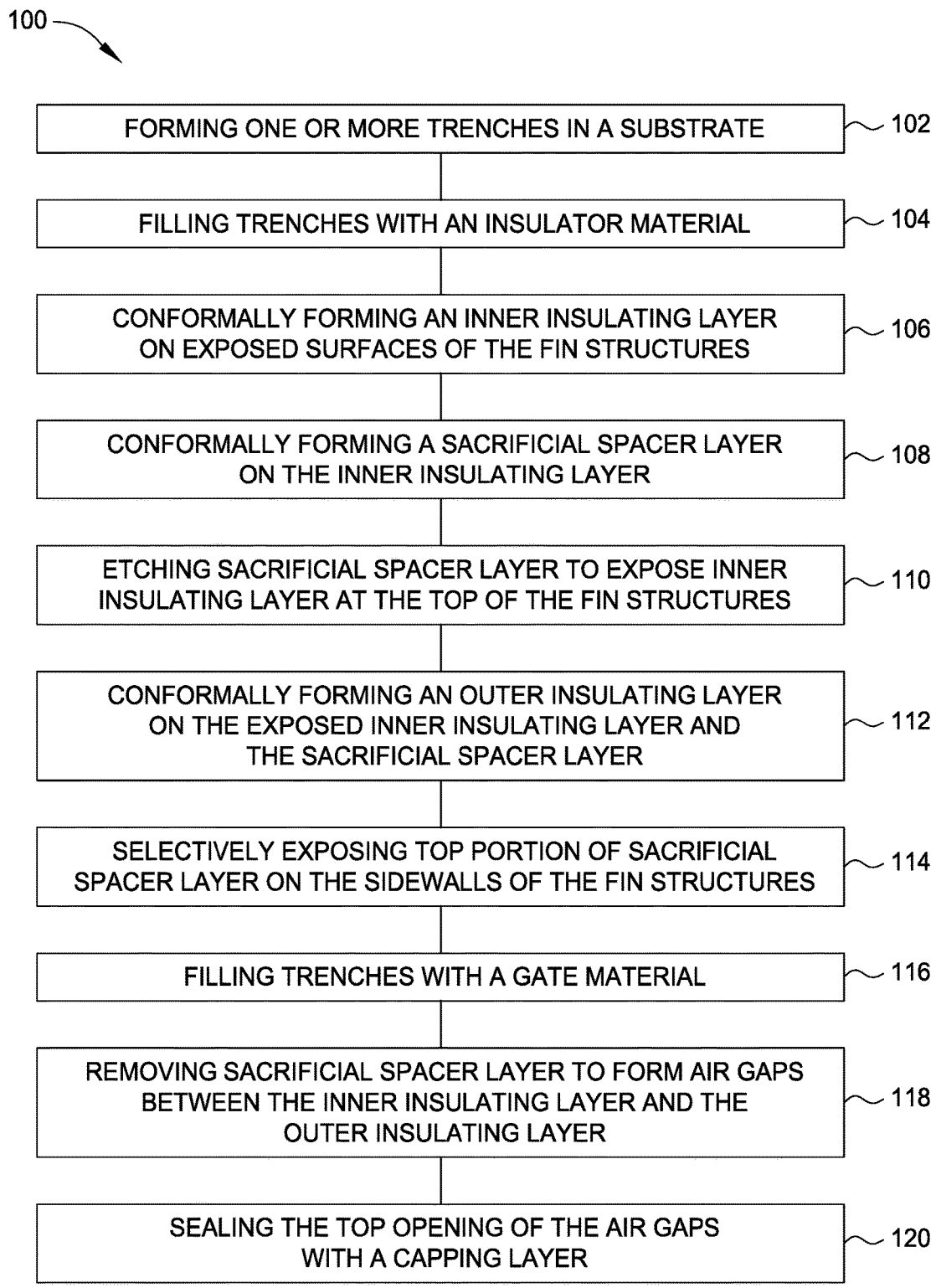
FIG. 1 is an exemplary process sequence for forming a multi-fin FinFET transistor.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

FIG. 1 is an exemplary process sequence 100 for forming a multi-fin FinFET transistor. FIGS. 2A-2H illustrates perspective views of a simplified multi-fin FinFET transistor during certain stages of fabrication according to the process sequence of FIG. 1. Although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

Figure 2A:
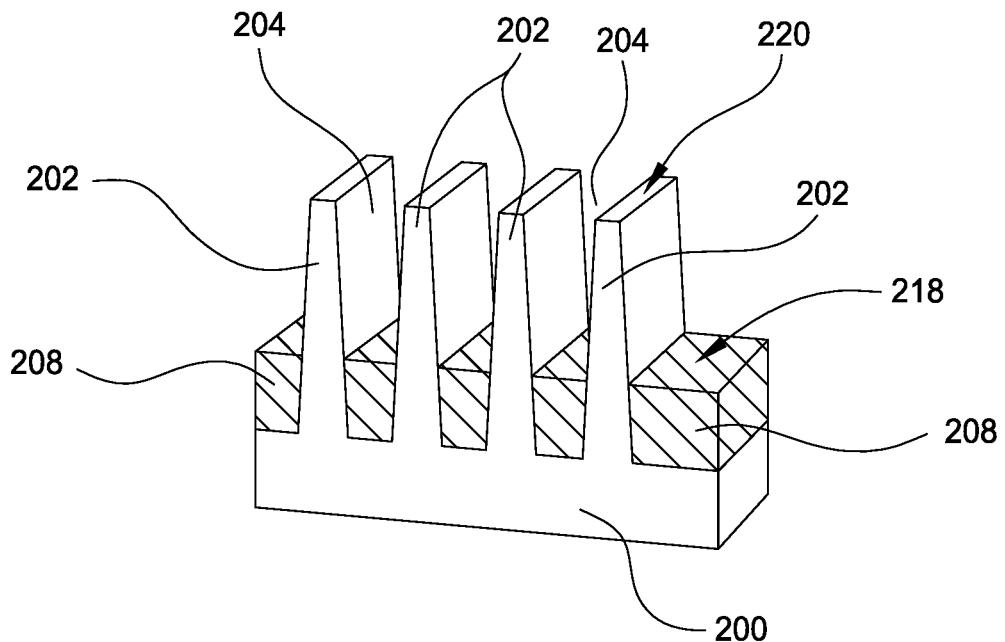
FIGS. 2A-2H illustrates perspective views of a simplified multi-fin FinFET transistor during certain stages of fabrication according to the process sequence of FIG. 1.

The process sequence 100 of this disclosure begins at block 102 by forming one or more trenches 204 in a substrate 200. The formation of the trenches 204 results in the substrate 200 with two or more fin structures 202, as shown in FIG. 2A. The fin structures 202 protrude outwardly from a surface of the substrate 200 as a three-dimensional structure. The fin structures 202 may serve as the bottom electrode for the transistor. The fin structure 202 may have a generally rectangular cross-section or a cross-section with some other shape, such as elongated wedge-shaped body as shown. While four fin structures 202 are shown as an example, it is contemplated that the substrate may be etched to provide more or less fin structures, depending on the application. The trench 204 may have a high aspect ratio. The ratio of trench height to trench width (i.e., the aspect ratio) may be about 20 to 1, 18 to 1, 16 to 1, 14 to 1, 12 to 1, 10 to 1, 9 to 1, 8 to 1, 7 to 1, 6 to 1, 5 to 1, 4 to 1, 3 to 1, or 2 to 1, for instance. In one example, the trench 204 has an aspect ratio of 10:1. The trenches 204 may have a generally constant cross-sectional profile along at least a portion of its length. In various implementations, the distance between two immediately adjacent trenches 204 may be about 3 nm to about 20 nm, for example about 5 nm to about 7 nm.

The term "substrate" used herein is intended to broadly cover any object that can be processed in a process chamber. For example, the substrate 200 may be any substrate capable of having material deposited thereon, such as a silicon substrate, for example silicon (doped or undoped), crystalline silicon (e.g., Si<100> or Si<111>), silicon oxide, strained silicon, doped or undoped polysilicon, or the like, germanium, a III-V compound substrate, a silicon germanium (SiGe) substrate, a silicon germanium carbide (SiGeC) substrate, a silicon germanium oxide (SiGeO) substrate, a silicon germanium oxynitride (SiGeON) substrate, a silicon carbide (SiC) substrate, a silicon carbonitride (SiCN) substrate, a silicon carbonoxide (SiCO), an epi substrate, a silicon-on-insulator (SOI) substrate, a carbon doped oxide, a silicon nitride, a display substrate such as a liquid crystal display (LCD), a plasma display, an electro luminescence (EL) lamp display, a solar array, solar panel, a light emitting diode (LED) substrate, a patterned or non-patterned semiconductor wafer, glass, sapphire, or any other materials such as metals, metal alloys, and other conductive materials. In one exemplary implementation, the substrate 200 is a 300 mm monocrystalline silicon-containing substrate doped with boron at a density of $1 \times 10^{16}$ atoms/cm$^3$.

At block 104, the trenches 204 are filled with an insulator material 208. The fin structures 202 are separated from one another by sections of insulator material 208, so that the fin structures 202 are interleaved between the sections of insulator material 208. The insulator material 208 may be any oxide suitable for shallow trench isolation (STI). For example, the insulator material 208 may be silicon oxide (SiO), silicon dioxide (SiO$_2$), silicon nitride (SiN), silicon carbonitride (SiCN), silicon oxynitride (SiON), aluminum oxide, or other suitable dielectric materials or high-k dielectric materials. The insulator material 208 may be deposited using any suitable deposition process, such as a chemical vapor deposition (CVD) process, or plasma-enhanced chemical vapor depositin (PECVD) process. The insulator material 208 is then etched back using a selective oxide recess etch to achieve a desired depth within the trenches 204, as shown in FIG. 2A. For sub-10 nm node FinFETs, the depth of the trench 204 may be between about 30 nm and about 400 nm, measuring from a top surface 218 of the trench 204 to a top surface 220 of the fin structure 202.

Figure 2B:
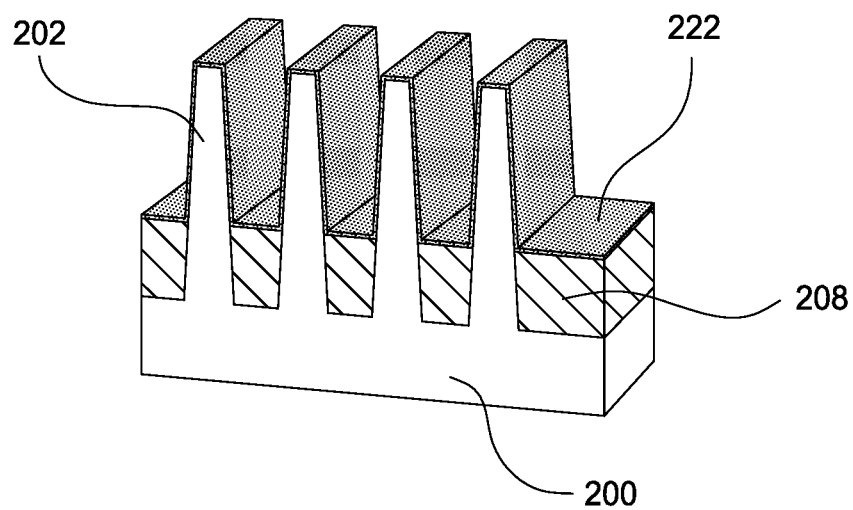

At block 106, an inner insulating layer 222 is conformally formed on exposed surfaces of the fin structures 202 and the insulator materials 208, as shown in FIG. 2B. The inner insulating layer 222 may include, but is not limited to, silicon nitride (Si$_3$N$_4$), silicon dioxide (SiO$_2$), silicon oxynitride (SiON), aluminum oxide (Al$_2$O$_3$), tantalum pentoxide (Ta$_2$O$_5$), or other material having similar insulating and structural properties. In one implementation, the inner insulating layer 222 is Si$_3$N$_4$. The inner insulating layer 222 may be deposited using any suitable deposition process, such as an atomic layer deposition (ALD) process, a chemical vapor deposition (CVD) process, a low-pressure chemical vapor deposition (LPCVD), or plasma-enhanced chemical vapor deposition (PECVD) process.

In one example, the inner insulating layer 222 is deposited using ALD. An exemplary deposition system that can be used is the Olympia™ ALD system, available from Applied Materials, Inc. located in Santa Clara, Calif. The inner insulating layer 222 may have a thickness of about 1 nm to about 10 nm, for example 2 nm to about 5 nm. In one example, the as deposited inner insulating layer 222 has a thickness of 1 nm. In another example, the as deposited inner insulating layer 222 has a thickness of 2 nm.

Figure 2C:
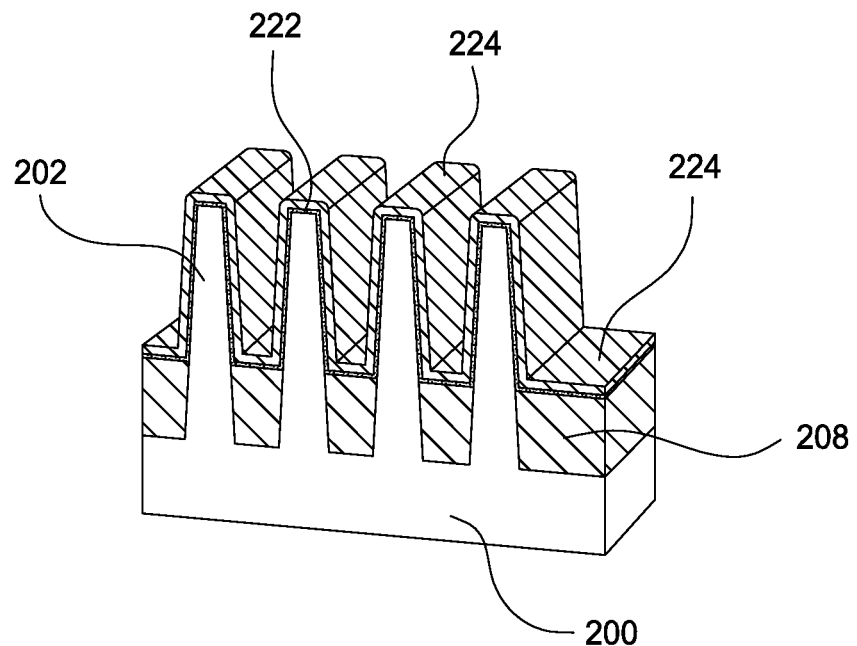
Figure 2D:
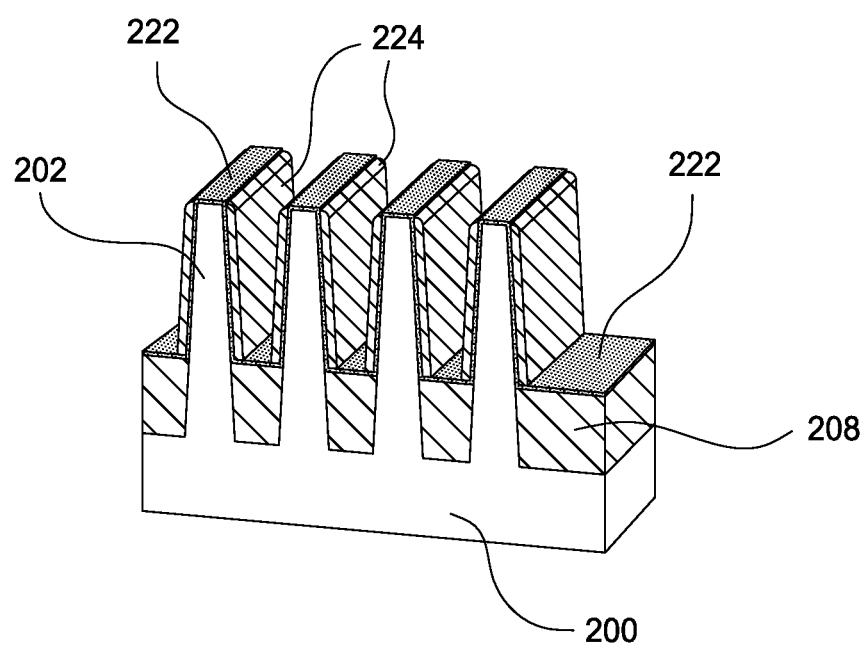

At block 108, a sacrificial spacer layer 224 is conformally deposited on the inner insulating layer 222, as shown in FIG. 2C. In one implementation, the sacrificial spacer layer 224 includes an aluminum oxide based material, such as aluminum oxide (Al$_2$O$_3$) or aluminum oxynitride (AlON). In another implementation, the sacrificial spacer layer 224 includes a titanium nitride based material, such as titanium nitride (TiN). The aluminum oxide based materials and titanium nitride based materials are advantageous because these materials, when exposed to dry etch plasma, have high selectivity (>10:1) to silicon nitride (Si$_3$N$_4$), silicon dioxide (SiO$_2$), and poly-silicon (a-Si), which are exemplary materials used for the inner insulating layer 222 (block 106), the insulator material 208 (block 104), and the gate material 228 (block 116). The sacrificial spacer layer 224 may be deposited using any suitable deposition process, such as an atomic layer deposition (ALD) process or a chemical vapor deposition (CVD). In one example, the sacrificial spacer layer 224 is deposited using ALD. The sacrificial spacer layer 224 may be deposited in the Olympia™ ALD system, available from Applied Materials, Inc. located in Santa Clara, Calif. The sacrificial spacer layer 224 may have a thickness of about 3 nm to about 12 nm, such as about 4 nm to about 8 nm, for example about 5 nm. In one example, the as deposited sacrificial spacer layer 224 has a thickness of 7 nm. The thickness of the sacrificial spacer layer 224 defines the air gap spacing after removal of the sacrificial spacer layer 224 in the later stage. It has been determined by the present inventors that forming an air gap spacing at 5 nm or above while reducing Si$_3$N$_4$ sidewall thickness from 2 nm to 1 nm is advantageous as it maximizes capacitance reduction for the multi-fin FinFET transistor with no subsequent width reduction even after high temperature annealing.

At block 110, the sacrificial spacer layer 224 is subjected to a directional etch process to expose the underlying inner insulating layer 222 located at the top of the fin structures 202 and above the insulator material 208, as shown in FIG.

2D. The sacrificial spacer layer 224 on the sidewalls of the fin structures 202 remains intact after the directional etch process. The directional etch process may be performed in an inductively coupled plasma chamber using argon (Ar) and boron trichloride ($BCl_3$). The boron trichloride ($BCl_3$) is introduced into the plasma chamber at a first volumetric flowrate, and the argon (Ar) is introduced into the plasma chamber at a second volumetric flowrate. A ratio of the first volumetric flowrate to the second volumetric flowrate may be about 1:6 to about 1:15, for example about 1:8 to about 1:10. It has been observed by the inventors of the present disclosure that lower gas flow ratio and low bias power are the keys to achieve high etch selectivity to silicon nitride ($Si_3N_4$). For example, it has been determined that the ratio of the first volumetric flowrate to the second volumetric flowrate of about 1:10 or above can have low etch rate (e.g., 60A/min) with high selectivity of 10:1 or above, for example 13:1 or above, to silicon nitrides. The high selectivity described herein means the sacrificial spacer layer 224 are etched at a higher rate than the insulating layer 222 (e.g., greater than 5×). As a result, the sacrificial spacer layer 224 is etched away while the insulating layer 222 is left substantially intact.

In some implementations, the etch process time may be increased to over etch the sacrificial spacer layer 224, thereby enhancing the etch selectivity to silicon nitride ($Si_3N_4$). In one example, the sacrificial spacer layer 224 is etched to its etch end point followed by a 50% or above over etch, for example a 75% over etch. In some examples, the sacrificial spacer layer 224 is etched to its etch end point followed by a 150% or above over etch, for example a 200% over etch.

For a 300 mm substrate, the following process parameters may be used. The temperature of a substrate support may be from about 50° C. to about 200° C., such as about 75° C. to about 100° C., for example about 90° C. The chamber pressure may be about 1 mTorr to about 80 mTorr, such as about 3 mTorr to about 20 mTorr, for example about 5 mTorr. The flow rate of $BCl_3$ may be from about 20 sccm to about 150 sccm, such as about 35 sccm to about 80 sccm, for example about 50 sccm. The flow rate of argon may be about 150 sccm to about 350 sccm, such as about 200 sccm to about 300 sccm, for example about 250 sccm. The source power to the coil may be about 100 W to about 1000 W, such as about 250 W to about 600 W, for example about 400 W. The bias power to the substrate support may be about 10 W to about 80 W, such as about 20 W to about 40 W, for example about 25 W. The etch process time may be between about 5 seconds to about 600 seconds, such as about 30 seconds to about 360 seconds, for example about 120 seconds. The etch process time may vary depending upon the desired etch profile. An exemplary etch chamber that can be used is the Centura® AdvantEdge™ Mesa™ etch chamber, available from Applied Materials, Inc. located in Santa Clara, Calif.

Figure 2E:
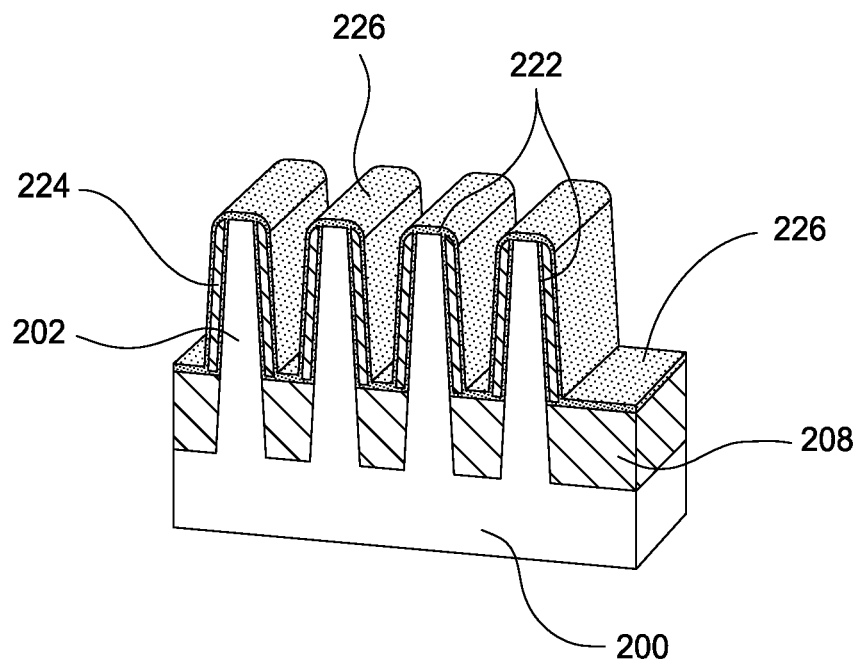

At block 112, an outer insulating layer 226 is conformally formed on the exposed inner insulating layer 222 and the sacrificial spacer layer 224, as shown in FIG. 2E. The inner insulating layer 222 and the outer insulating layer 226 are deposited to prevent damage to the high-k material during $Al_2O_3$ deposition and etch processes in the subsequent stages. The outer insulating layer 222 may use the same material as the inner insulating layer 222, for example, silicon nitride ($Si_3N_4$), silicon dioxide ($SiO_2$), silicon oxynitride (SiON), aluminum oxide ($Al_2O_3$), tantalum pentoxide ($Ta_2O_5$), or other material having similar insulating and structural properties. In one implementation, the outer insulating layer 226 is $Si_3N_4$. The outer insulating layer 226 may be deposited using any suitable deposition process, such as an atomic layer deposition (ALD) process, a chemical vapor deposition (CVD) process, a low-pressure chemical vapor deposition (LPCVD), or plasma-enhanced chemical vapor deposition (PECVD) process. In one example, the outer insulating layer 226 is deposited using ALD. An exemplary deposition system that can be used is the Olympia™ ALD system, available from Applied Materials, Inc. located in Santa Clara, Calif. The outer insulating layer 226 may have a thickness of about 1 nm to about 10 nm, for example 2 nm to about 5 nm. In one example, the as deposited outer insulating layer 226 has a thickness of 1 nm. In anther example, the as deposited outer insulating layer 226 has a thickness of 2 nm.

Figure 2F:
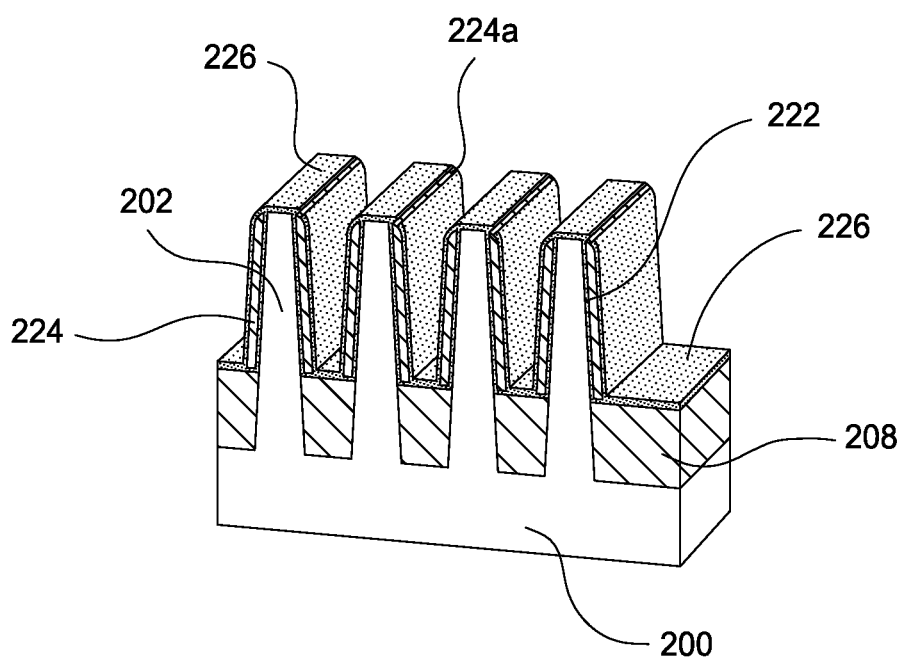

At block 114, an optional etch process may be performed to selectively expose the top portion 224a of the sacrificial spacer layer 224 on the sidewalls of the fin structures 202, as shown in FIG. 2F. The etching may be done using any suitable dry etch or wet etch process. In one example, the optional etch process is a dry etch process using an inductively coupled plasma source. The plasma may be formed from a precursor gas including, for example, argon, nitrogen, hydrogen, carbon monoxide, ammonia, or helium. Alternatively, a halogen-based precursor may be used to form the plasma. The etch process may be performed in Centura® AdvantEdge™ Mesa™ etch chamber, available from Applied Materials, Inc. located in Santa Clara, Calif.

Figure 2G:
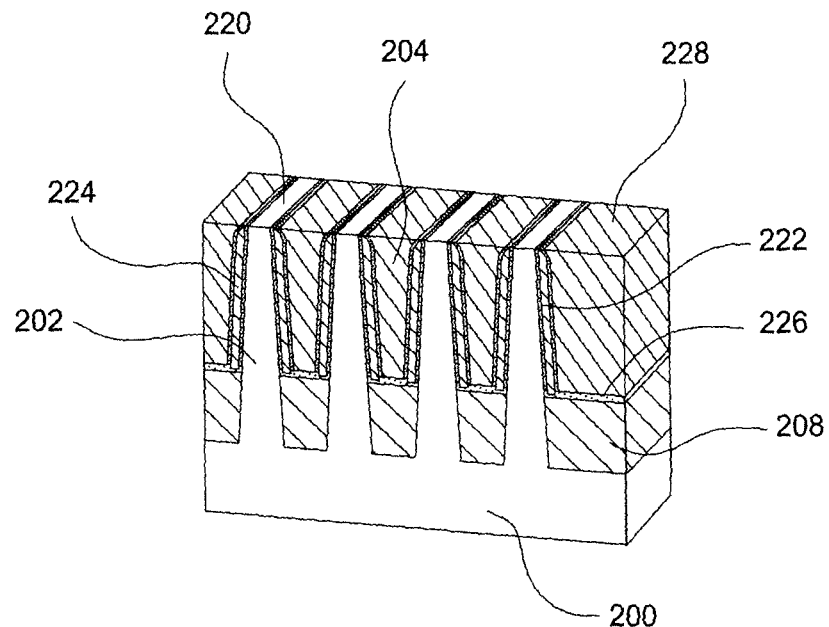

At block 116, the trenches 204 are filled with a gate material 228. The gate material 228 may be consisted of amorphous silicon (a-Si) or polycrystalline silicon (poly-Si), either doped or un-doped. The gate material 228 may include conductive materials such as metal. In one implementation, the gate material 228 is poly-Si. Alternatively, the gate material 228 may be deposited within the trenches 204 in form of an amorphous film and then subjected to a high temperature process to convert the amorphous film to a poly crystalline state. The gate material 228 may be deposited using any suitable deposition process, such as a chemical vapor deposition (CVD) process, a low pressure CVD (LPCVD) process, or a physical vapor deposition (PVD) process. The gate material 228 may be deposited to a desired thickness, for example about 100 nm. The gate material 228 is then polished using a chemical mechanical polishing (CMP) to expose the top surface 220 of the fin structures 202 and the top portion 224a of the sacrificial spacer layer 224 on the sidewalls of the fin structures 202, as shown in FIG. 2G.

Figure 2H:
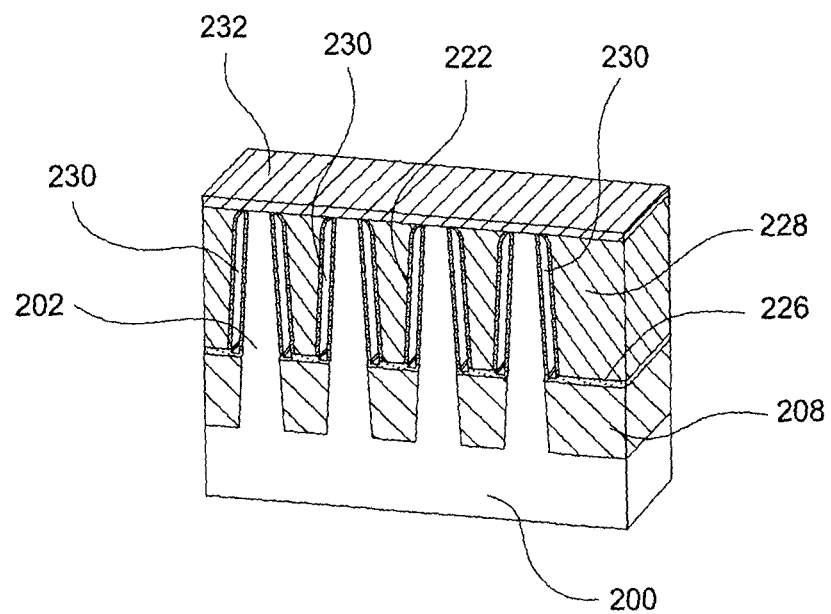

At block 118, the sacrificial spacer layer 224 is selectively removed, as shown in FIG. 2H. Removing the sacrificial spacer layer 224 results in the air gaps 230 formed in the region between the remaining inner insulating layer 222 and the remaining outer insulating layer 226. Since air has the lowest dielectric constant of any material, the inclusion of air gaps 230 along the height direction of the fin structures 202 (i.e., along the sidewalls of the fin structures 202) reduces the overall dielectric constant of the multi-fin FinFET transistor. The multi-fin FinFET transistor therefore has sidewall spacers formed of air gap upon completion of removal of the sacrificial spacer layer 224. It has been observed that using air gap composer spacer along the sidewalls of the fin structures can reduce sidewall spacer capacitance by over 70% as compared to sidewall spacers formed from other conventional material such as SiN, $SiO_2$, or poly-Si. As a result, parasitic capacitance between the adjacent components (e.g., the gate electrode and the source/drain regions formed near the fin structure) is reduced.

The sacrificial spacer layer 224 may be removed by wet etch or dry etch process. The etch process should use an etchant that has good selectivity to $Si_3N_4$, $SiO_2$, and poly-Si. In one exemplary embodiment using a wet etch process, the sacrificial spacer layer 224 is removed by immersing the substrate 200 in a SPM chemical solution in the form of an aqueous solution obtained by mixing sulfuric acid (97%) and a hydrogen peroxide solution in a volume ratio of about 4:1. The wet etch process may be performed for about 3 seconds to about 30 seconds, for example about 5 seconds to about 15 seconds. After the immersion, the substrate 200 may be rinsed with pure water for about 5 minutes to about 10 minutes and dried with air or nitrogen blow. While SPM chemical solution is discussed, it is contemplated that other wet etch solutions, such as hydrochloric acid/hydrogen peroxide mixture (HPM), ammonium hydrogen peroxide mixture (APM), diluted hydrofluoric acid (DHF), FPM (a mixed solution of hydrofluoric acid, hydrogen peroxide water, and pure water), or the like may also be used.

It has been observed that the 30 nm deep air gap is visible after 3 seconds of SPM, and the sacrificial spacer layer 224 is removed completely after 5 seconds of SPM.

While the sacrificial spacer layer 224 is described to be removed before contact metallization, in some implementations the sacrificial spacer layer 224 is removed after the contact metallization. This is because SPM wet etch may only used before the contact metallization. In such a case, the sacrificial spacer layer 224 can be removed by a plasma formed from either boron trichloride ($BCl_3$) or hydrogen bromide (HBr).

At block 120, after the sacrificial spacer layer 224 has been removed from the region between the inner insulating layer 222 and the outer insulating layer 226, a capping layer 232 is deposited on the substrate 200 to seal the top opening of the air gaps 230, as shown in FIG. 2H. The capping layer 232 may include, but is not limited to silicon nitride ($Si_3N_4$), silicon oxynitride (SiON), silicon carbonitride (SICN), or other materials suitable for sealing the top opening of the air gaps 230. In one implementation, the capping layer 232 is $Si_3N_4$. The capping layer 232 may be deposited using any suitable deposition process, such as a chemical vapor deposition (CVD) process, an atomic layer deposition (ALD) process, a chemical vapor deposition (CVD) process, a low-pressure chemical vapor deposition (LPCVD), or plasma-enhanced chemical vapor deposition (PECVD) process. In one example, the capping layer 232 is deposited using a relatively low temperature (e.g., approximately 250° C. to 350° C.) PECVD process. The capping layer 232 may have a thickness of about 5 nm to about 30 nm, for example 10 nm to about 20 nm. In one example, the as deposited capping layer 232 has a thickness of 15 nm. FIG. 4(c) shows the substrate state in FIG. 2H (i.e., after air gap spacer sealing with 150 Å PECVD $Si_3N_4$). As can be seen, no narrowing of the air gap is observed after sealing with $Si_3N_4$. FIG. 4(c) also confirms that the air gap spacer formed using implementations of the present disclosure is residue-free and highly uniform.

After block 120, the substrate 200 may be subjected to additional processes needed to complete the transistor. For example, an epitaxial film may be grown over sidewalls of each fin structure 202 to form source and drain regions for the multi-fin FinFET transistor. Some possible structural modifications are contemplated. For example, between block 104 and block 106, a sacrificial gate structure may be formed over the one or more fin structures 202. The sacrificial gate structure may be formed at a position straddling the one or more fin structures 202. The sacrificial gate structure may protrude from the substrate 200 as a second fin overlying the one or more fin structures 202. A trench can be formed into the sacrificial gate structure and filled with a metal, a gate dielectric material or a high-k gate dielectric material that may be needed for a FinFET transistor. The second fin can be configured to control a flow of charge carriers within a channel region disposed within the one or more fin structures.

The foregoing outlines features of several implementations so that those skilled in the art may better understand the aspects of the present disclosure. Those skilled in the art should appreciate that they may readily use the present disclosure as a basis for modifying other processes and structures to achieve a desired transistor. It is contemplated that the implementations of the present disclosure are applicable to FinFET integration process flow technology and future gate-all-around transistors.

Benefits of the present disclosure include using aluminum oxide based materials or titanium nitride based materials as a sacrificial material for forming air gap spacers. The selected materials show excellent etch selectivity to $Si_3N_4$, $SiO_2$ and poly-Si and can be removed successfully with no corner erosion occurring even after 78% spacer over etch. No subsequent air gap narrowing is observed after sealing with $Si_3N_4$ and the following high-temperature annealing process. The approach of the present disclosure has been proved to be able to create a 4 nm or above consistent and uniform air gap spacer with an aspect ratio of 10:1 along a fin structure without residue. It has been observed that the gate-to-source/drain contact-plug parasitic capacitance is decreased by 70% as compared to sidewall spacers formed from other conventional material such as SiN, $SiO_2$, or poly-Si.

While the foregoing is directed to embodiments of the present disclosure, other and further embodiments of the disclosure may be devised without departing from the basic scope thereof.

The invention claimed is:

1. A method of forming a transistor device, comprising:
   forming a three-dimensional fin structure on a substrate, the three-dimensional fin structure comprising a top surface and two opposing sidewalls;
   forming a first insulating layer conformally on the top surface and the two opposing sidewalls of the three-dimensional fin structure;
   forming a sacrificial spacer layer conformally on the first insulating layer, wherein the sacrificial spacer layer comprises an aluminum oxide based material or a titanium nitride based material;
   subjecting the sacrificial spacer layer to a directional etch process to expose the first insulating layer at the top surface of the three-dimensional fin structure;
   forming a second insulating layer conformally on the first insulating layer at the top surface of the three-dimensional fin structure and the sacrificial spacer layer on the two opposing sidewalls of the three-dimensional fin structure;
   exposing a top portion of the sacrificial spacer layer on the two opposing sidewalls of the three-dimensional fin structure; and
   selectively removing the sacrificial spacer layer to create an air gap spacer between the first insulating layer and the second insulating layer.

2. The method of claim 1, wherein selectively removing the sacrificial spacer layer is performed by immersing the substrate in an aqueous solution obtained by mixing sulfuric acid and a hydrogen peroxide solution in a volume ratio of about 4:1.

3. The method of claim 1, wherein selectively removing the sacrificial spacer layer is performed by exposing the substrate to a plasma formed from boron trichloride ($BCl_3$) or hydrogen bromide (HBr).

4. The method of claim 1, wherein subjecting the sacrificial spacer layer to a directional etch process is performed by flowing argon (Ar) into a plasma chamber at a first volumetric flowrate and flowing boron trichloride ($BCl_3$) into the plasma chamber at a second volumetric flowrate, and a ratio of the first volumetric flowrate to the second volumetric flowrate is about 1:10 or above.

5. The method of claim 4, wherein subjecting the sacrificial spacer layer to a directional etch process comprising:
providing a bias power to a substrate support at about 0.028 W/cm$^2$ to about 0.056 W/cm$^2$.

6. The method of claim 1, wherein the aluminum oxide based material is aluminum oxide ($Al_2O_3$) or aluminum oxynitride (AlON).

7. The method of claim 1, wherein the titanium nitride based material is titanium nitride (TiN).

8. The method of claim 1, wherein the sacrificial spacer layer has a thickness of about 4 nm to about 8 nm.

9. The method of claim 1, wherein the first insulating layer has a thickness of about 2 nm to about 5 nm and the second insulating layer has a thickness of about 2 nm to about 5 nm.

10. The method of claim 1, wherein the first insulating layer and the second insulating layer each comprises silicon nitride ($Si_3N_4$), silicon dioxide ($SiO_2$), silicon oxynitride (SiON), aluminum oxide ($Al_2O_3$), or tantalum pentoxide ($Ta_2O_5$).

11. The method of claim 10, wherein the first insulating layer and the second insulating layer each comprises silicon nitride ($Si_3N_4$).

12. A method of forming a transistor device in a processing chamber, comprising:
forming a three-dimensional fin structure on a substrate, the three-dimensional fin structure comprising a top surface and two opposing sidewalls;
forming a sacrificial spacer layer between a first insulating layer and a second insulating layer, wherein the first insulating layer is conformally formed on the top surface and the two opposing sidewalls of the three-dimensional fin structure, wherein the sacrificial spacer layer comprises an aluminum oxide based material or a titanium nitride based material; and
exposing the first insulating layer at the top surface of the three-dimensional fin structure by selectively removing the sacrificial spacer layer with an inductively coupled plasma, wherein selectively removing the sacrificial spacer layer is performed by flowing argon (Ar) into a plasma chamber at a first volumetric flowrate and flowing boron trichloride ($BCl_3$) into the plasma chamber at a second volumetric flowrate, and a ratio of the first volumetric flowrate to the second volumetric flowrate is about 1:10 or above and applying a bias power to a substrate support on which the substrate is disposed at about 0.028 W/cm$^2$ to about 0.056 W/cm$^2$; and
removing the sacrificial spacer layer to create an air gap spacer between the first insulating layer and the second insulating layer by immersing the substrate in an aqueous solution obtained by mixing sulfuric acid and a hydrogen peroxide solution in a volume ratio of about 4:1, and the air gap spacer has a thickness of about 4 nm or above.

13. A method of forming a transistor device, comprising:
forming a dielectric layer over a substrate;
forming a plurality of three-dimensional fins from a surface of the substrate, the plurality of three-dimensional fins extending vertically through the dielectric layer and above a top surface of the dielectric layer, each three-dimensional fin comprising a top surface and two opposing sidewalls;
forming a first insulating layer on the top surface and the two opposing sidewalls of the three-dimensional fin;
forming a sacrificial spacer layer on the first insulating layer;
subjecting the sacrificial spacer layer to a directional etch process to expose the first insulating layer at the top surface of the three-dimensional fin;
forming a second insulating layer on the first insulating layer at the top surface of the three-dimensional fin and the sacrificial spacer layer on the two opposing sidewalls of the three-dimensional fin;
selectively removing a portion of the second insulating layer to expose a top portion of the sacrificial spacer layer on the two opposing sidewalls of the three-dimensional fin;
filling trenches between the three-dimensional fin with a gate material;
performing a planarization process on the substrate until the top surface of the three-dimensional fin and the top portion of the sacrificial spacer layer are exposed; and
selectively removing the sacrificial spacer layer to create an air gap spacer along the two opposing sidewalls of each of the plurality of three-dimensional fins between the first insulating layer and the second insulating layer.

14. The method of claim 13, further comprising:
forming a capping layer disposed on exposed surfaces of each of the three-dimensional fin, the first insulating layer, the second insulating layer, the air gap spacer, and the gate material.

15. The method of claim 13, wherein the sacrificial spacer layer comprises an aluminum oxide based material or a titanium nitride based material.

16. The method of claim 15, wherein the aluminum oxide based material is aluminum oxide ($Al_2O_3$) or aluminum oxynitride (AlON).

17. The method of claim 15, wherein the titanium nitride based material is titanium nitride (TiN).

18. The method of claim 13, wherein selectively removing the sacrificial spacer layer is performed by exposing the substrate to a plasma formed from boron trichloride ($BCl_3$) or hydrogen bromide (HBr).

19. The method of claim 13, wherein subjecting the sacrificial spacer layer to a directional etch process is performed by flowing argon (Ar) into a plasma chamber at a first volumetric flowrate and flowing boron trichloride ($BCl_3$) into the plasma chamber at a second volumetric flowrate, and a ratio of the first volumetric flowrate to the second volumetric flowrate is about 1:10 or above.

20. The method of claim 13, wherein subjecting the sacrificial spacer layer to a directional etch process comprising:
providing a bias power to a substrate support at about 0.028 W/cm$^2$ to about 0.056 W/cm$^2$.

* * * * *